US012575081B2

(12) United States Patent
Toda et al.

(10) Patent No.: US 12,575,081 B2
(45) Date of Patent: Mar. 10, 2026

(54) SEMICONDUCTOR DEVICE AND SEMICONDUCTOR MEMORY DEVICE THAT INCLUDE AN OXIDE SEMICONDUCTOR LAYER PROVIDED BETWEEN A FIRST ELECTRODE AND A SECOND ELECTRODE

(71) Applicant: Kioxia Corporation, Tokyo (JP)

(72) Inventors: Masaya Toda, Yokkaichi (JP); Tomoki Ishimaru, Yokkaichi (JP); Ha Hoang, Kuwana (JP); Kota Takahashi, Yokkaichi (JP); Kazuhiro Matsuo, Kuwana (JP); Takafumi Ochiai, Kuwana (JP); Shoji Honda, Kuwana (JP); Kenichiro Toratani, Yokkaichi (JP); Kiwamu Sakuma, Yokkaichi (JP); Taro Shiokawa, Nagoya (JP); Mutsumi Okajima, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 679 days.

(21) Appl. No.: 17/929,422

(22) Filed: Sep. 2, 2022

(65) Prior Publication Data

US 2023/0328957 A1      Oct. 12, 2023

(30) Foreign Application Priority Data

Mar. 23, 2022     (JP) ................................. 2022-047567

(51) Int. Cl.
| | | |
|---|---|---|
| *H10B 12/00* | (2023.01) | |
| *H10D 30/67* | (2025.01) | |
| *H10D 64/68* | (2025.01) | |

(52) U.S. Cl.
CPC ............. *H10B 12/30* (2023.02); *H10B 12/20* (2023.02); *H10B 12/31* (2023.02); (Continued)

(58) Field of Classification Search
CPC ........ H10B 12/20; H10B 12/30; H10B 12/31; H10D 30/6728; H10D 30/6735; (Continued)

(56) References Cited

U.S. PATENT DOCUMENTS

| | | | |
|---|---|---|---|
| 7,566,620 B2 | 7/2009 | Abbott | |
| 7,635,630 B2 | 12/2009 | Bhattacharyya | |
| (Continued) | | | |

FOREIGN PATENT DOCUMENTS

| | | | | |
|---|---|---|---|---|
| JP | 2019-169490 A | 10/2019 | | |
| JP | 2023136275 A | * 9/2023 | ......... | H10D 30/6706 |
| TW | 202103321 A | 1/2021 | | |

*Primary Examiner* — Matthew E Warren
(74) *Attorney, Agent, or Firm* — Oblon, McClelland, Maier & Neustadt, L.L.P.

(57) ABSTRACT

A semiconductor device of embodiments includes: a first electrode; a second electrode; an oxide semiconductor layer provided between the first electrode and the second electrode; a gate electrode surrounding the oxide semiconductor layer; and a gate insulating layer provided between the gate electrode and the oxide semiconductor layer, spaced from the first electrode, and containing nitrogen (N). In addition, a first distance between the first electrode and the gate insulating layer in a first direction from the first electrode to the second electrode is smaller than a second distance between the first electrode and the gate electrode in the first direction.

20 Claims, 16 Drawing Sheets

(52) U.S. Cl.
CPC ..... *H10D 30/6728* (2025.01); *H10D 30/6735* (2025.01); *H10D 30/6736* (2025.01); *H10D 30/6755* (2025.01); *H10D 30/6756* (2025.01); *H10D 30/6757* (2025.01); *H10D 64/683* (2025.01); *H10D 64/685* (2025.01)

(58) Field of Classification Search
CPC .......... H10D 30/6736; H10D 30/6755; H10D 30/6756; H10D 30/6757; H10D 64/68; H10D 64/683; H10D 64/685
See application file for complete search history.

(56) References Cited

U.S. PATENT DOCUMENTS

| | | | |
|---|---|---|---|
| 10,790,396 B2 | 9/2020 | Sawabe et al. | |
| 11,349,033 B2* | 5/2022 | Ishimaru | H10B 12/05 |
| 11,430,886 B2* | 8/2022 | Sato | H10D 86/201 |
| 11,462,542 B2* | 10/2022 | Wada | H10B 12/488 |
| 11,672,110 B2* | 6/2023 | Doornbos | H10D 30/62 |
| | | | 257/43 |
| 2019/0296155 A1 | 9/2019 | Sawabe et al. | |
| 2020/0006350 A1* | 1/2020 | Zhang | H10D 30/63 |
| 2020/0185396 A1* | 6/2020 | Juengling | H10B 53/30 |
| 2020/0381557 A1* | 12/2020 | Hattori | H10D 30/6755 |
| 2021/0202485 A1* | 7/2021 | Inaba | H10B 12/05 |

* cited by examiner

AA' CROSS SECTION

SECOND DIRECTION

100

SECOND DIRECTION

FIRST DIRECTION

SEMICONDUCTOR DEVICE AND SEMICONDUCTOR MEMORY DEVICE THAT INCLUDE AN OXIDE SEMICONDUCTOR LAYER PROVIDED BETWEEN A FIRST ELECTRODE AND A SECOND ELECTRODE

CROSS-REFERENCE TO RELATED APPLICATION

This application is based upon and claims the benefit of priority from Japanese Patent Application No. 2022-047567, filed on Mar. 23, 2022, the entire contents of which are incorporated herein by reference.

FIELD

Embodiments described herein relate generally to a semiconductor device and a semiconductor memory device.

BACKGROUND

An oxide semiconductor transistor in which a channel is formed in an oxide semiconductor layer has an excellent characteristic that the channel leakage current during off operation is very small. For this reason, for example, the oxide semiconductor transistor can be applied to a switching transistor of a memory cell of a dynamic random access memory (DRAM).

DETAILED DESCRIPTION

Figure 1:
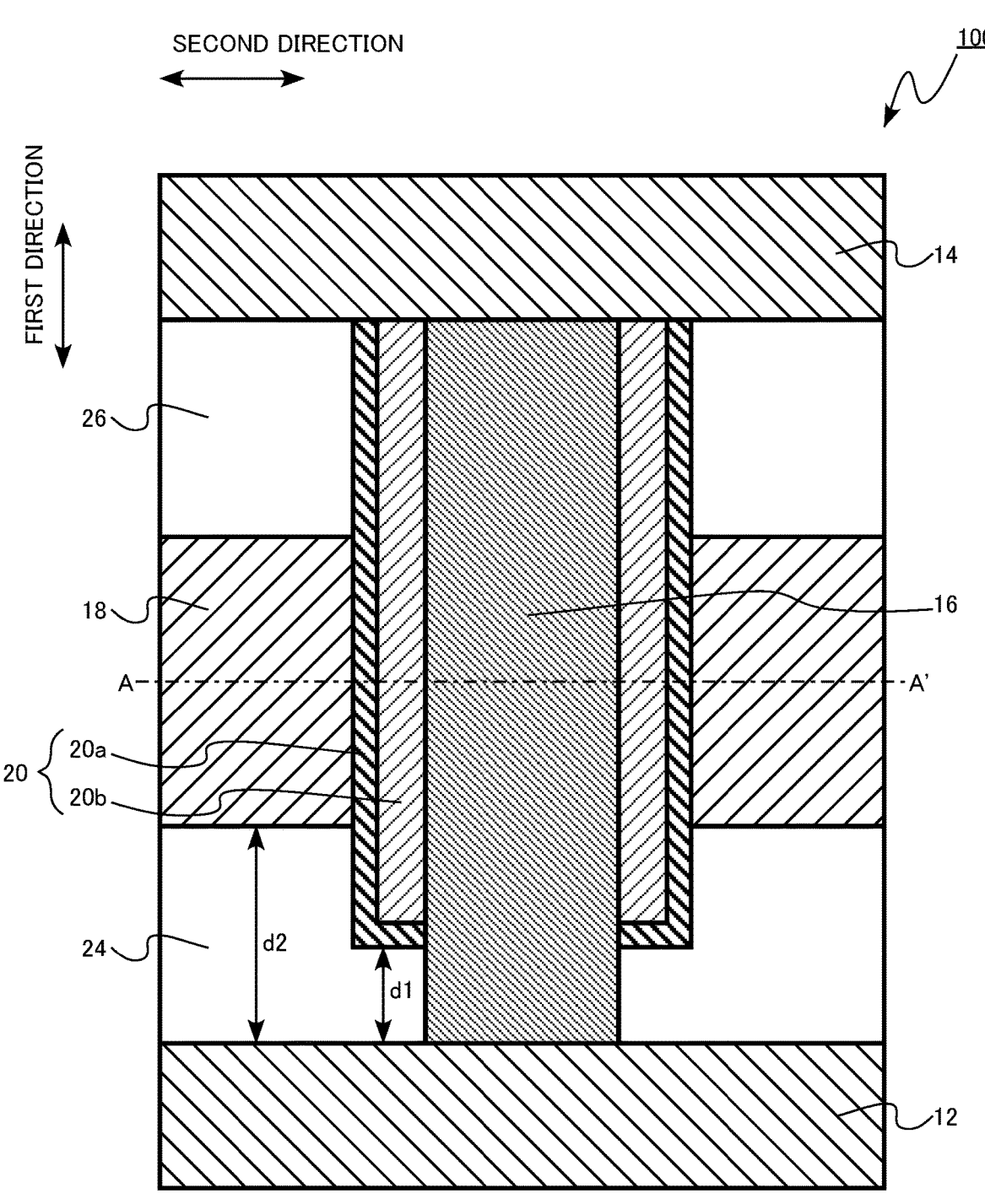
FIG. 1 is a schematic cross-sectional view of a semiconductor device according to a first embodiment.

A semiconductor device of embodiments includes: a first electrode; a second electrode; an oxide semiconductor layer provided between the first electrode and the second electrode; a gate electrode surrounding the oxide semiconductor layer; and a gate insulating layer provided between the gate electrode and the oxide semiconductor layer, spaced from the first electrode, and containing nitrogen (N). A first distance between the first electrode and the gate insulating layer in a first direction from the first electrode to the second electrode is smaller than a second distance between the first electrode and the gate electrode in the first direction.

Hereinafter, embodiments will be described with reference to the diagrams. In the following description, the same or similar members and the like may be denoted by the same reference numerals, and the description of the members and the like once described may be omitted as appropriate.

In addition, in this specification, the term "upper" or "lower" may be used for convenience. "Upper" or "lower" is a term indicating the relative positional relationship in the diagram, but is not a term that defines the positional relationship with respect to gravity.

The qualitative analysis and quantitative analysis of the chemical composition of members configuring the semiconductor device and the semiconductor memory device in this specification can be performed by, for example, secondary ion mass spectrometry (SIMS), energy dispersive X-ray spectroscopy (EDX), and Rutherford back-scattering spectroscopy (RBS). In addition, when measuring the thickness of each member forming the semiconductor device and the semiconductor memory device, a distance between members, a crystal particle size, and the like, for example, a transmission electron microscope (TEM) can be used.

First Embodiment

A semiconductor device according to a first embodiment includes: a first electrode; a second electrode; an oxide semiconductor layer provided between the first electrode and the second electrode; a gate electrode surrounding the oxide semiconductor layer; and a gate insulating layer provided between the gate electrode and the oxide semiconductor layer, spaced from the first electrode, and containing nitrogen (N). In addition, a first distance between the first electrode and the gate insulating layer in a first direction from the first electrode to the second electrode is smaller than a second distance between the first electrode and the gate electrode in the first direction.

Figure 2:
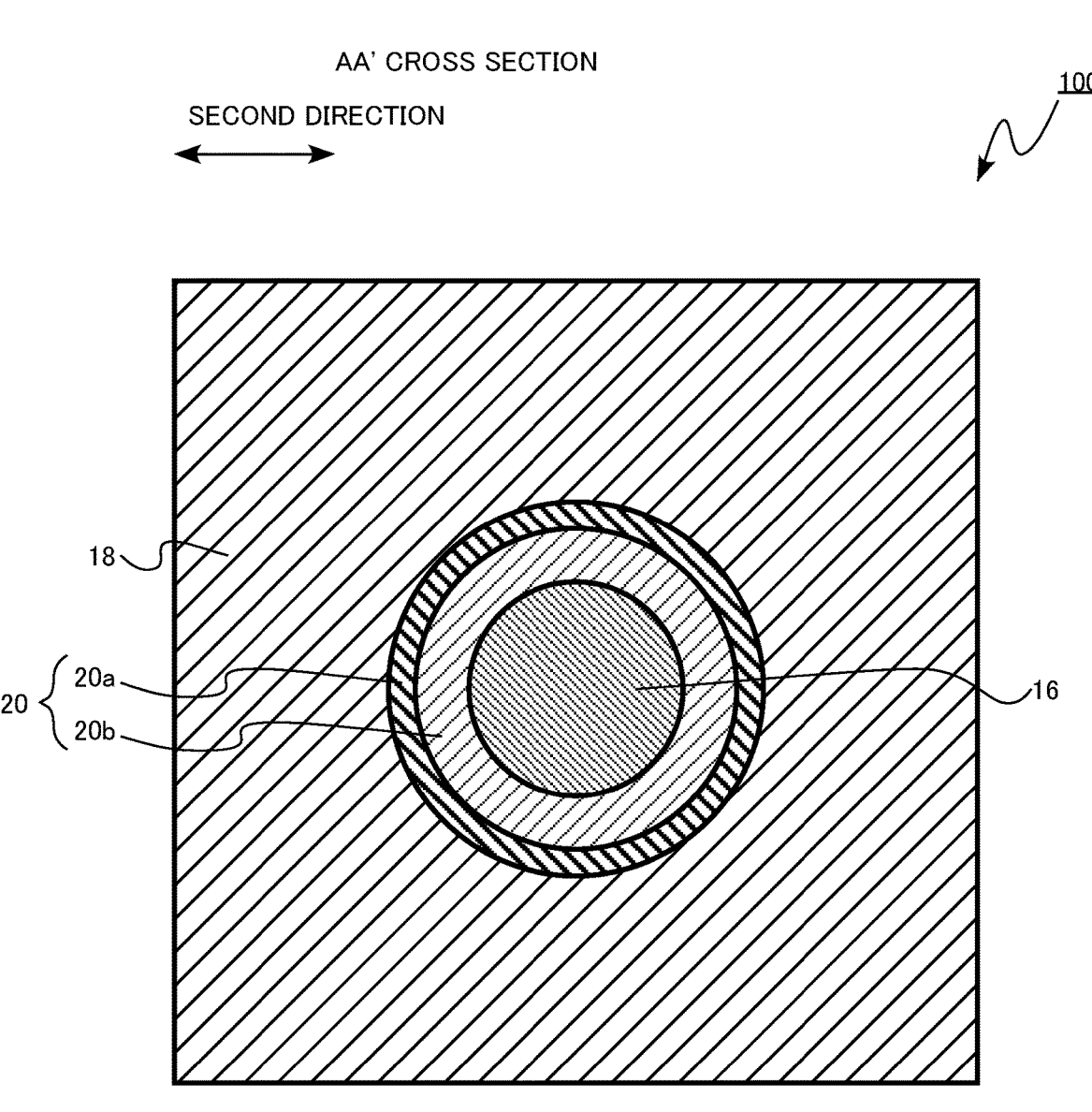
FIG. 2 is a schematic cross-sectional view of the semiconductor device according to the first embodiment.

FIGS. 1 and 2 are schematic cross-sectional views of the semiconductor device according to the first embodiment. FIG. 2 is a cross-sectional view taken along the line AA' of FIG. 1. In FIG. 1, the vertical direction is referred to as a first direction. In FIG. 1, the horizontal direction is referred to as a second direction. The second direction is perpendicular to the first direction.

The semiconductor device according to the first embodiment is a transistor 100. The transistor 100 is an oxide semiconductor transistor in which a channel is formed in the oxide semiconductor. In the transistor 100, a gate electrode is provided so as to surround an oxide semiconductor layer in which a channel is formed. The transistor 100 is a so-called surrounding gate transistor (SGT). The transistor 100 is a so-called vertical transistor.

The transistor 100 includes a first electrode 12, a second electrode 14, an oxide semiconductor layer 16, a gate electrode 18, a gate insulating layer 20, a first insulating layer 24, and a second insulating layer 26. The gate insulating layer 20 includes a first film 20a and a second film 20b.

The first film 20a is an example of the first region. The second film 20b is an example of the second region.

The first electrode 12 functions as a source electrode or a drain electrode of the transistor 100.

The first electrode 12 is a conductor. The first electrode 12 contains, for example, an oxide conductor or a metal. The first electrode 12 is, for example, an oxide conductor containing indium (In), tin (Sn), and oxygen (O). The first electrode 12 is, for example, an indium tin oxide. The first electrode 12 is, for example, a metal containing tungsten (W), molybdenum (Mo), copper (Cu), aluminum (Al), titanium (Ti), nickel (Ni), platinum (Pt), or tantalum (Ta). The first electrode 12 is, for example, a titanium nitride or a nickel sulfide.

The first electrode 12 may have, for example, a stacked structure of a plurality of conductors.

The second electrode 14 functions as a source electrode or a drain electrode of the transistor 100. The direction from the first electrode 12 to the second electrode 14 is the first direction.

The second electrode 14 is a conductor. The second electrode 14 contains, for example, an oxide conductor or a metal. The second electrode 14 is, for example, an oxide conductor containing indium (In), tin (Sn), and oxygen (O). The second electrode 14 is, for example, an indium tin oxide. The second electrode 14 is, for example, a metal containing tungsten (W), molybdenum (Mo), copper (Cu), aluminum (Al), titanium (Ti), nickel (Ni), platinum (Pt), or tantalum (Ta). The second electrode 14 is, for example, a titanium nitride or a nickel sulfide.

The second electrode 14 may have, for example, a stacked structure of a plurality of conductors.

The first electrode 12 and the second electrode 14 are formed of, for example, the same material. For example, the first electrode 12 and the second electrode 14 are oxide conductors containing indium (In), tin (Sn), and oxygen (O). Each of the first electrode 12 and the second electrode 14 is, for example, an indium tin oxide.

The oxide semiconductor layer 16 is provided between the first electrode 12 and the second electrode 14. The oxide semiconductor layer 16 is in contact with the first electrode 12. The oxide semiconductor layer 16 is in contact with the second electrode 14.

The length of the oxide semiconductor layer 16 in the first direction is, for example, equal to or more than 80 nm and equal to or less than 200 nm. The width of the oxide semiconductor layer 16 in the second direction is, for example, equal to or more than 20 nm and equal to or less than 50 nm.

The oxide semiconductor layer 16 is an oxide semiconductor. The oxide semiconductor layer 16 is, for example, amorphous.

The oxide semiconductor layer 16 contains, for example, zinc (Zn), oxygen (O), and at least one element selected from a group consisting of indium (In), gallium (Ga), silicon (Si), aluminum (Al), and tin (Sn). The oxide semiconductor layer 16 contains, for example, indium (In), gallium (Ga), and zinc (Zn). The oxide semiconductor layer 16 contains, for example, indium (In), aluminum (Al), and zinc (Zn).

The oxide semiconductor layer 16 contains, for example, at least one element selected from a group consisting of titanium (Ti), zinc (Zn), and tungsten (W). For example, the oxide semiconductor layer 16 contains titanium oxide, zinc oxide, or tungsten oxide.

The oxide semiconductor layer 16 has a chemical composition different from the chemical composition of the first electrode 12 and the chemical composition of the second electrode 14, for example.

The oxide semiconductor layer 16 includes, for example, oxygen vacancies. The oxygen vacancy in the oxide semiconductor layer 16 functions as a donor.

In a region of the oxide semiconductor layer 16 facing the gate electrode 18, a channel serving as a current path is formed when the transistor 100 is turned on.

The gate electrode 18 faces the oxide semiconductor layer 16. As shown in FIG. 2, the gate electrode 18 surrounds the oxide semiconductor layer 16. The gate electrode 18 is provided around the oxide semiconductor layer 16.

The gate electrode 18 is, for example, a metal, a metal compound, or a semiconductor. The gate electrode 18 contains, for example, tungsten (W).

The length of the gate electrode 18 in the first direction is, for example, equal to or more than 20 nm and equal to or less than 100 nm.

The gate insulating layer 20 is provided between the gate electrode 18 and the oxide semiconductor layer 16. The gate insulating layer 20 is provided so as to surround the oxide semiconductor layer 16. The gate insulating layer 20 is in contact with the oxide semiconductor layer 16.

The gate insulating layer 20 is spaced from the first electrode 12. The gate insulating layer 20 is spaced from the first electrode 12 in the first direction. The gate insulating layer 20 is in contact with the second electrode 14.

The first distance (d1 in FIG. 1) between the first electrode 12 and the gate insulating layer 20 in the first direction is smaller than the second distance (d2 in FIG. 1) between the first electrode 12 and the gate electrode 18 in the first direction. The first distance d1 is, for example, larger than the thickness of the gate insulating layer 20 in the second direction. The first distance d1 is, for example, equal to or more than 5 nm. The difference between the second distance d2 and the first distance d1 is, for example, larger than the thickness of the gate insulating layer 20 in the second direction.

The gate insulating layer 20 includes the first film 20a and the second film 20b. The second film 20b is provided between the first film 20a and the oxide semiconductor layer 16. The first film 20a is provided between the second film 20b and the gate electrode 18.

In the first direction, the first film 20a is provided between the first electrode 12 and the second film 20b. In the first direction, the first film 20a is provided between the first insulating layer 24 and the second film 20b.

The gate insulating layer 20 contains nitrogen (N).

The first film 20a contains nitrogen (N). The second film 20b contains or does not contain nitrogen (N). The nitrogen concentration of the first film 20a is higher than the nitrogen concentration of the second film 20b. The nitrogen concentration of the first film 20a is, for example, equal to or more than 10 times the nitrogen concentration of the second film 20b.

The first film 20*a* is, for example, a nitride film or an oxynitride film. The first film 20*a* contains, for example, silicon nitride, silicon oxynitride, aluminum nitride, aluminum oxynitride, hafnium nitride, hafnium oxynitride, zirconium nitride, or zirconium oxynitride. The first film 20*a* is, for example, a silicon nitride film, a silicon oxynitride film, an aluminum nitride film, an aluminum oxynitride film, a hafnium nitride film, a hafnium oxynitride film, a zirconium nitride film, or a zirconium oxynitride film.

The second film 20*b* is, for example, an oxide film or an oxynitride film. The second film 20*b* contains, for example, silicon oxide, silicon oxynitride, aluminum oxide, aluminum oxynitride, hafnium oxide, hafnium oxynitride, zirconium oxide, or zirconium oxynitride. The second film 20*b* is, for example, a silicon oxide film, a silicon oxynitride film, an aluminum oxide film, an aluminum oxynitride film, a hafnium oxide film, a hafnium oxynitride film, a zirconium oxide film, or a zirconium oxynitride film.

For example, the first film 20*a* contains silicon nitride and the second film 20*b* contains silicon oxide. For example, the first film 20*a* is a silicon nitride film, and the second film 20*b* is a silicon oxide film.

For example, the first film 20*a* contains silicon oxynitride and the second film 20*b* contains silicon oxide. For example, the first film 20*a* is a silicon oxynitride film and the second film 20*b* is a silicon oxide film.

For example, the first film 20*a* contains aluminum nitride and the second film 20*b* contains silicon oxide. For example, the first film 20*a* is an aluminum nitride film and the second film 20*b* is a silicon oxide film.

The thickness of the gate insulating layer 20 is, for example, equal to or more than 2 nm and equal to or less than 10 nm. The thickness of the second film 20*b* is, for example, larger than the thickness of the first film 20*a*.

The first insulating layer 24 is provided between the first electrode 12 and the gate electrode 18. The first insulating layer 24 surrounds the oxide semiconductor layer 16. The first insulating layer 24 surrounds, for example, the gate insulating layer 20. For example, the gate insulating layer 20 is provided between the first insulating layer 24 and the oxide semiconductor layer 16.

The first insulating layer 24 contains, for example, oxide. The first insulating layer 24 contains, for example, silicon oxide. The first insulating layer 24 is, for example, a silicon oxide layer.

The second insulating layer 26 is provided between the gate electrode 18 and the second electrode 14. The second insulating layer 26 surrounds the oxide semiconductor layer 16. The second insulating layer 26 surrounds, for example, the gate insulating layer 20. For example, the gate insulating layer 20 is provided between the second insulating layer 26 and the oxide semiconductor layer 16.

The second insulating layer 26 contains, for example, oxide. The second insulating layer 26 contains, for example, silicon oxide. The second insulating layer 26 is, for example, a silicon oxide layer.

Next, an example of a method for manufacturing the semiconductor device according to the first embodiment will be described.

FIGS. 3 to 9 are schematic cross-sectional views showing an example of a method for manufacturing the semiconductor device according to the first embodiment. FIGS. 3 to 9 each show a cross section corresponding to FIG. 1. FIGS. 3 to 9 are diagrams showing an example of a method for manufacturing the transistor 100.

First, a first indium tin oxide film 31, a first silicon oxide film 32, a tungsten layer 33, and a second silicon oxide film

Figure 3:
FIG. 3 is a schematic cross-sectional view showing an example of a method for manufacturing the semiconductor device according to the first embodiment.
Figure 3:
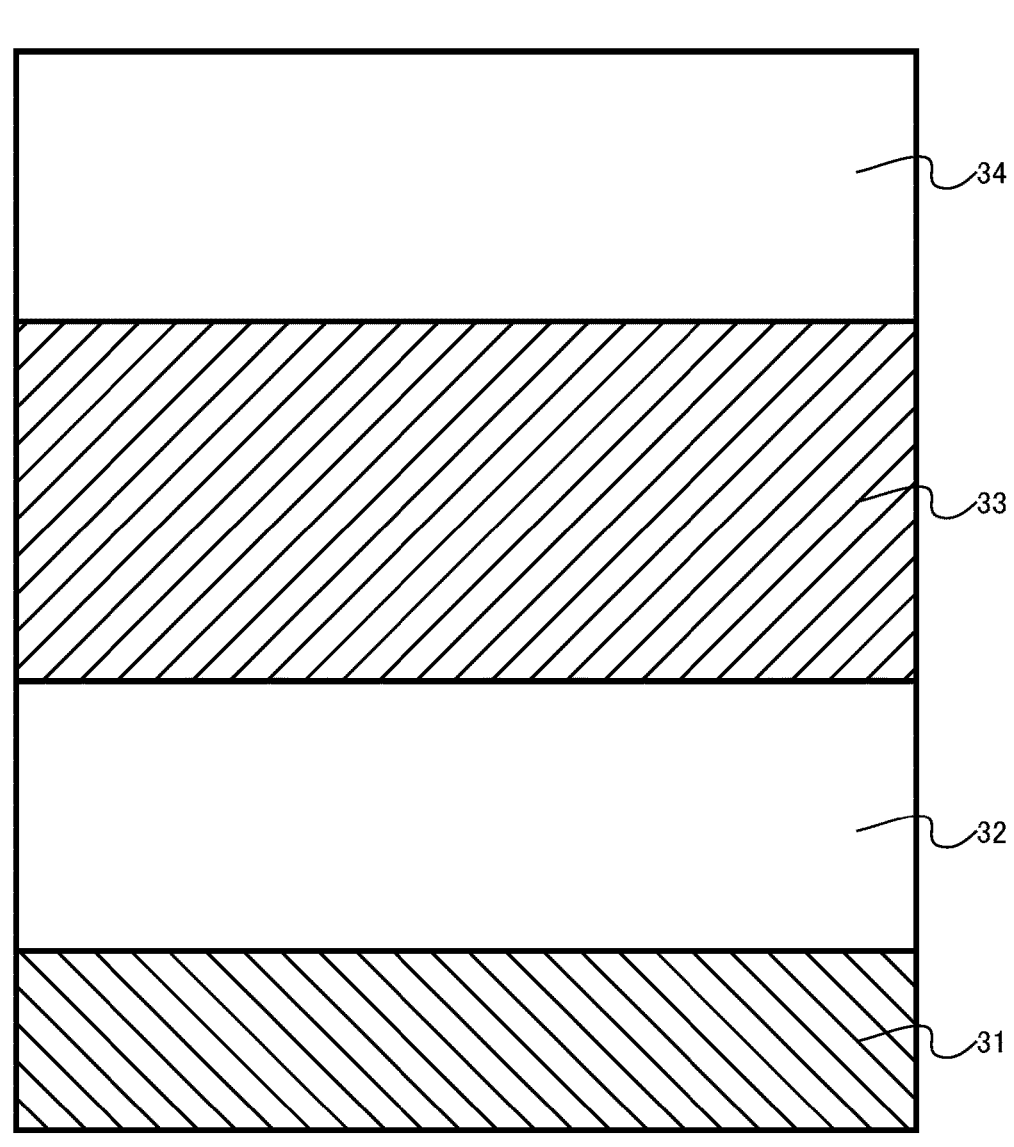

34 are stacked on a substrate (not shown) in this order in the first direction (FIG. 3). The first indium tin oxide film 31, the first silicon oxide film 32, the tungsten layer 33, and the second silicon oxide film 34 are formed by using, for example, a chemical vapor deposition method (CVD method).

The first indium tin oxide film 31 finally becomes the first electrode 12. A part of the first silicon oxide film 32 finally becomes the first insulating layer 24. A part of the tungsten layer 33 finally becomes the gate electrode 18. A part of the second silicon oxide film 34 finally becomes the second insulating layer 26.

Figure 4:
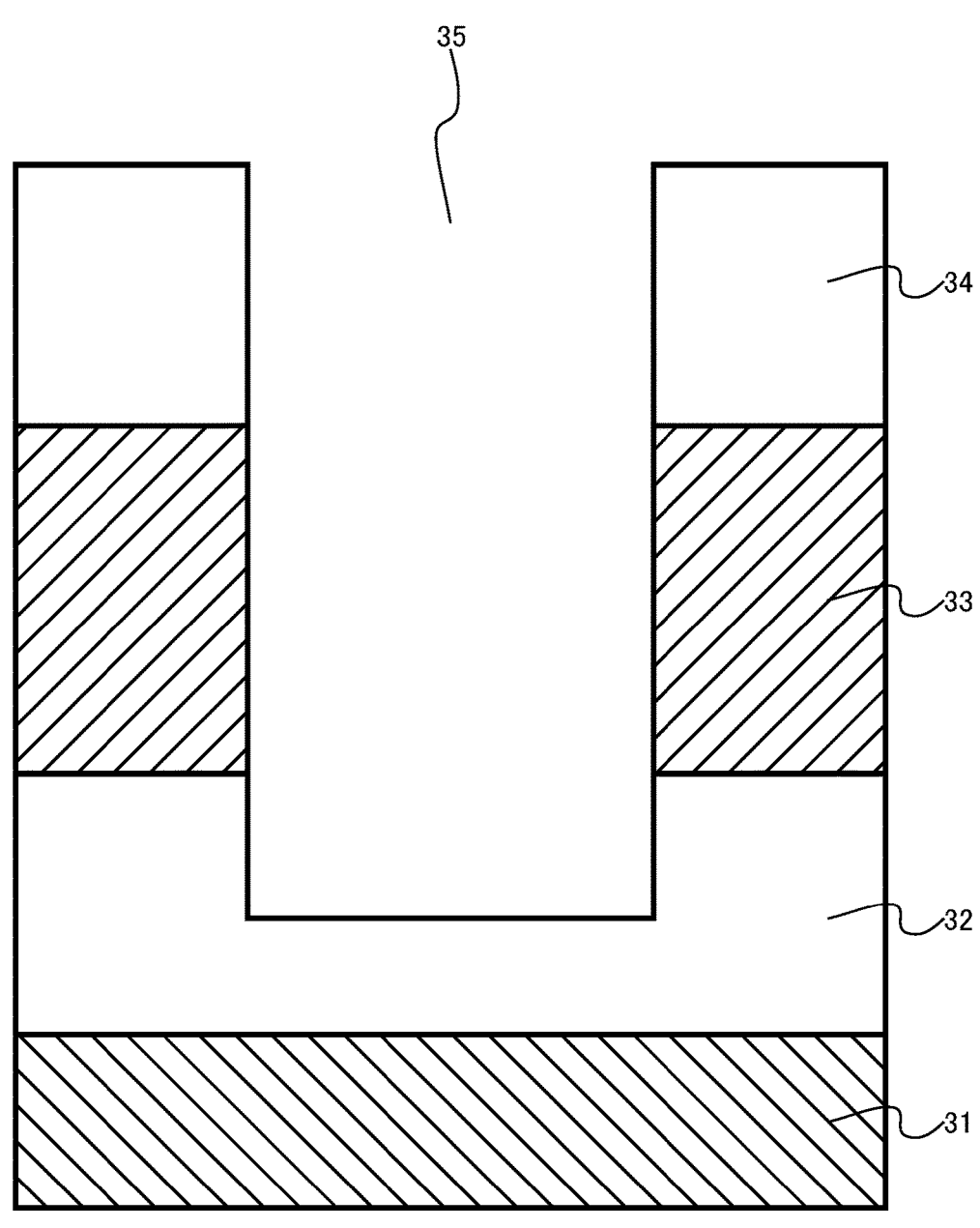
FIG. 4 is a schematic cross-sectional view showing an example of the method for manufacturing the semiconductor device according to the first embodiment.

Then, from the surface of the second silicon oxide film 34, an opening 35 is formed by penetrating the second silicon oxide film 34 and the tungsten layer 33 and removing a part of the first silicon oxide film 32 (FIG. 4). The opening 35 is formed by using, for example, a lithography method and a reactive ion etching method (RIE method).

Figure 5:
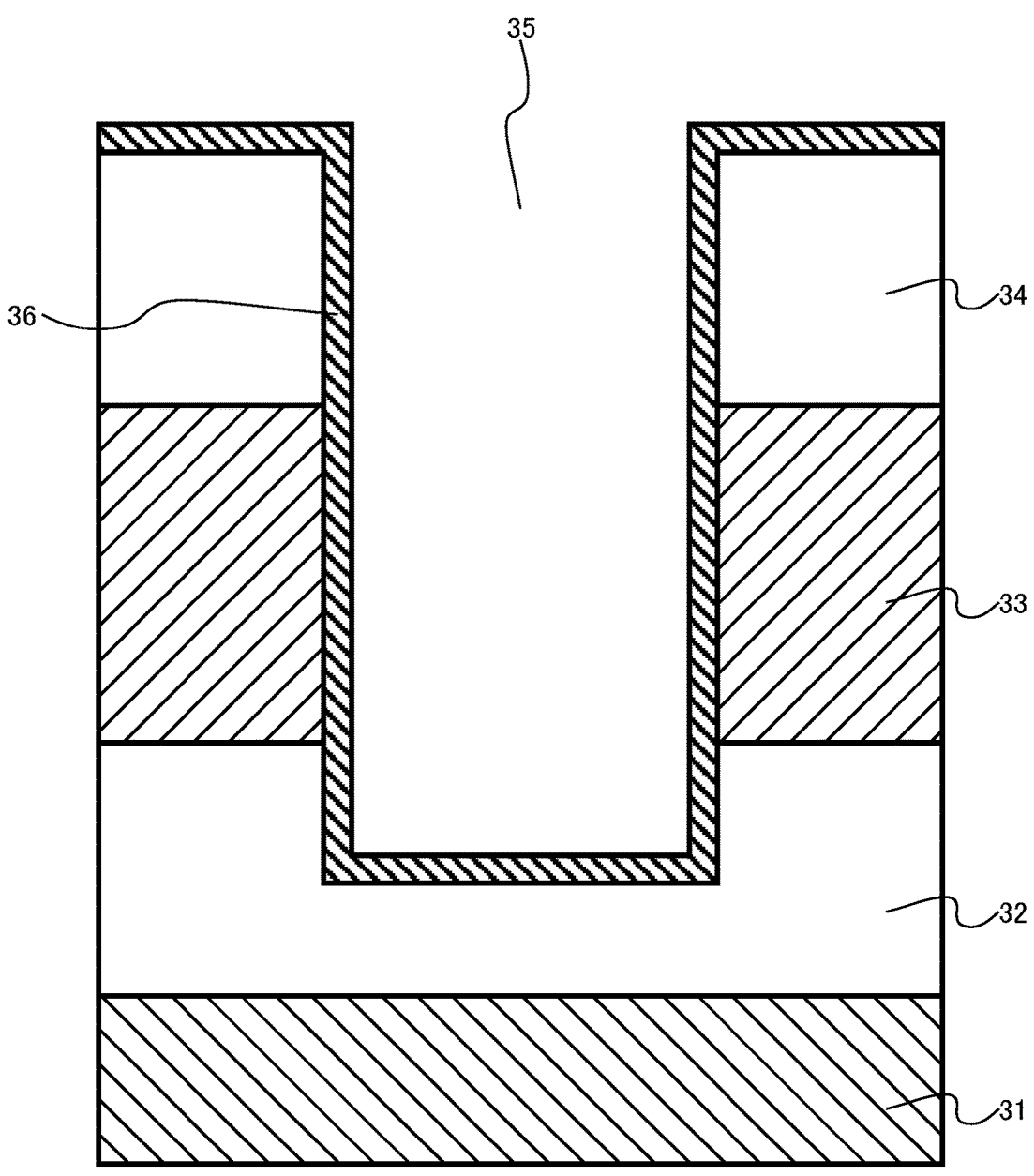
FIG. 5 is a schematic cross-sectional view showing an example of the method for manufacturing the semiconductor device according to the first embodiment.

Then, a silicon nitride film 36 is formed inside the opening 35 (FIG. 5). The silicon nitride film 36 is formed by using, for example, a CVD method. A part of the silicon nitride film 36 finally becomes the first film 20*a* of the gate insulating layer 20.

Figure 6:
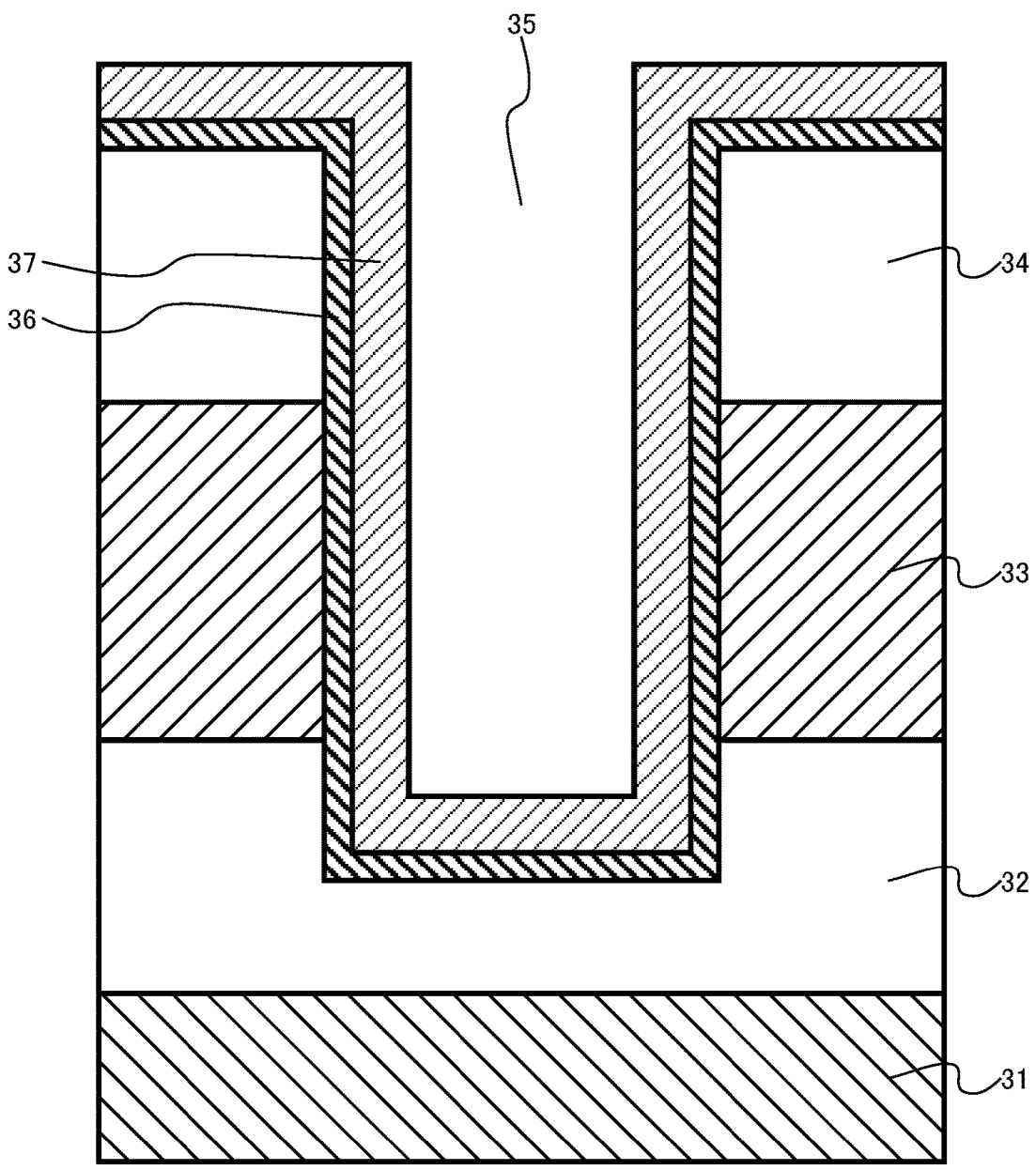
FIG. 6 is a schematic cross-sectional view showing an example of the method for manufacturing the semiconductor device according to the first embodiment.

Then, a third silicon oxide film 37 is formed inside the opening 35 (FIG. 6). The third silicon oxide film 37 is formed by using, for example, a CVD method. A part of the third silicon oxide film 37 finally becomes the second film 20*b* of the gate insulating layer 20.

Figure 7:
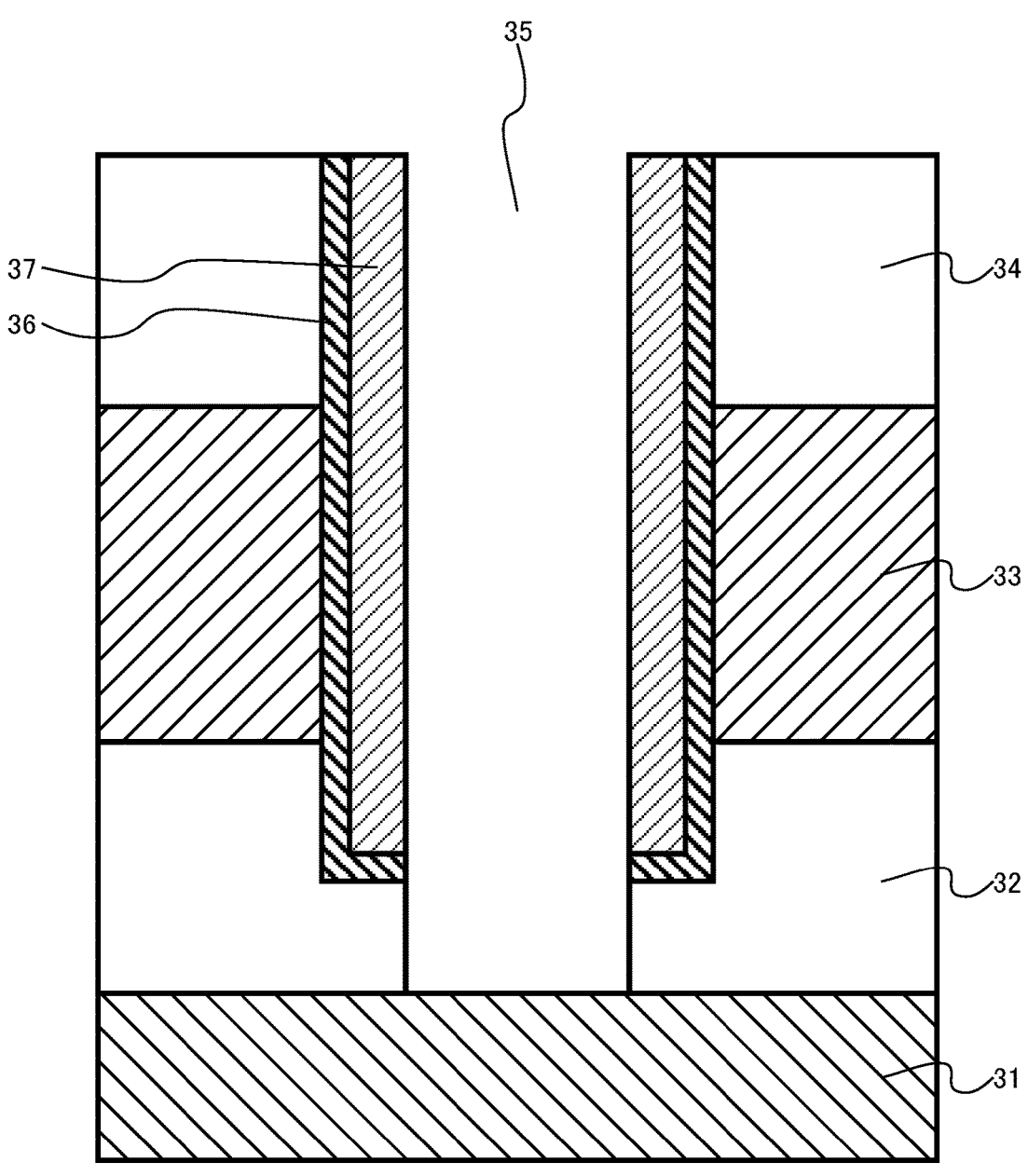
FIG. 7 is a schematic cross-sectional view showing an example of the method for manufacturing the semiconductor device according to the first embodiment.

Then, the third silicon oxide film 37, the silicon nitride film 36, and the first silicon oxide film 32 at the bottom of the opening 35 are etched to expose the first indium tin oxide film 31 (FIG. 7). The third silicon oxide film 37 and the silicon nitride film 36 on the surface of the second silicon oxide film 34 are also etched at the same time. The third silicon oxide film 37, the silicon nitride film 36, and the first silicon oxide film 32 are etched by using a RIE method.

Then, the opening 35 is buried with an oxide semiconductor film 38. A part of the oxide semiconductor film 38 becomes the oxide semiconductor layer 16.

The oxide semiconductor film 38 contains, for example, indium (In), gallium (Ga), and zinc (Zn). The oxide semiconductor film 38 is formed by using, for example, a CVD method.

Figure 8:
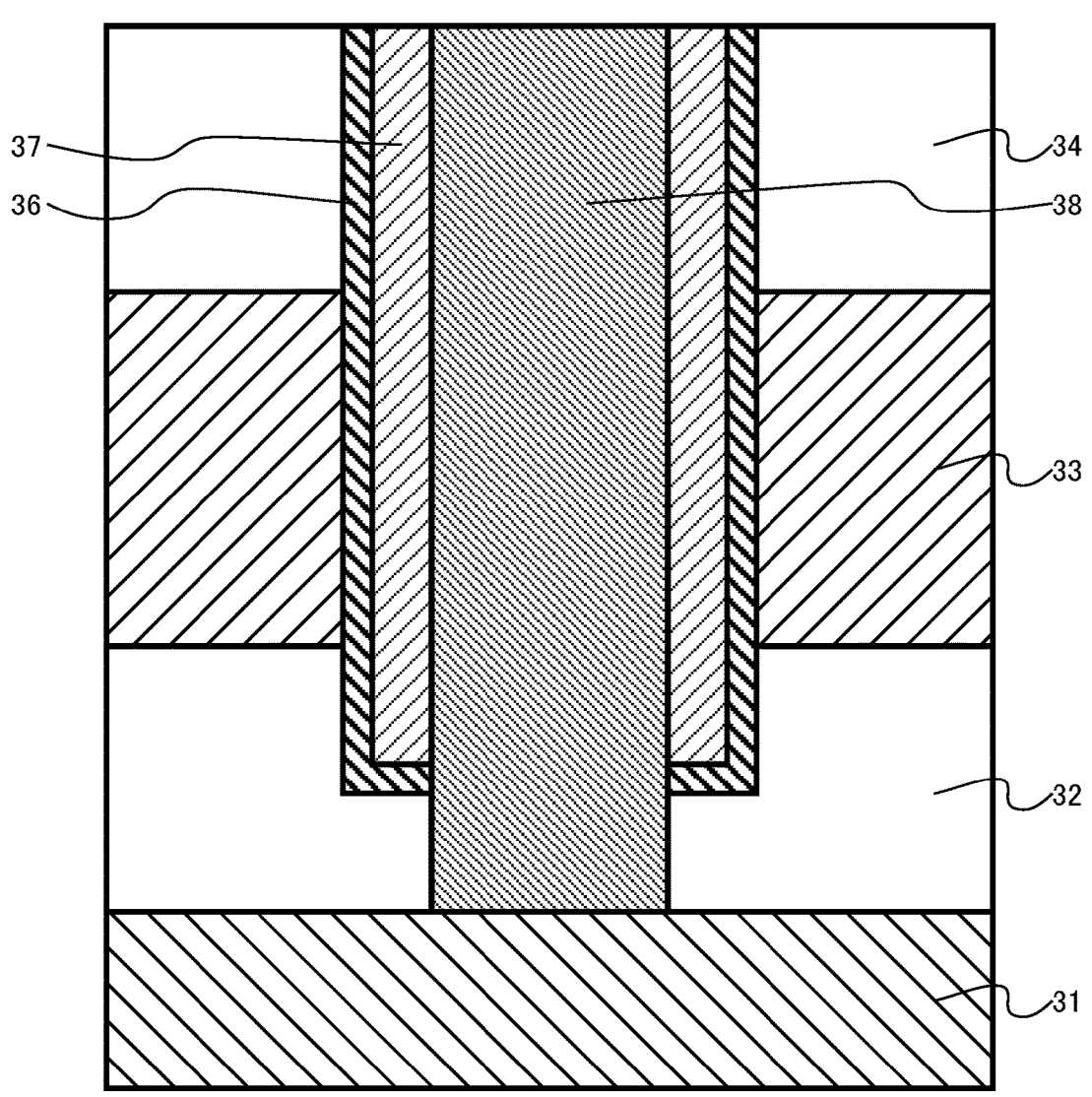
FIG. 8 is a schematic cross-sectional view showing an example of the method for manufacturing the semiconductor device according to the first embodiment.

Then, an upper portion of the oxide semiconductor film 38 is removed to expose the surface of the second silicon oxide film 34 (FIG. 8). For example, the oxide semiconductor film 38 is removed by etching using a RIE method.

Figure 9:
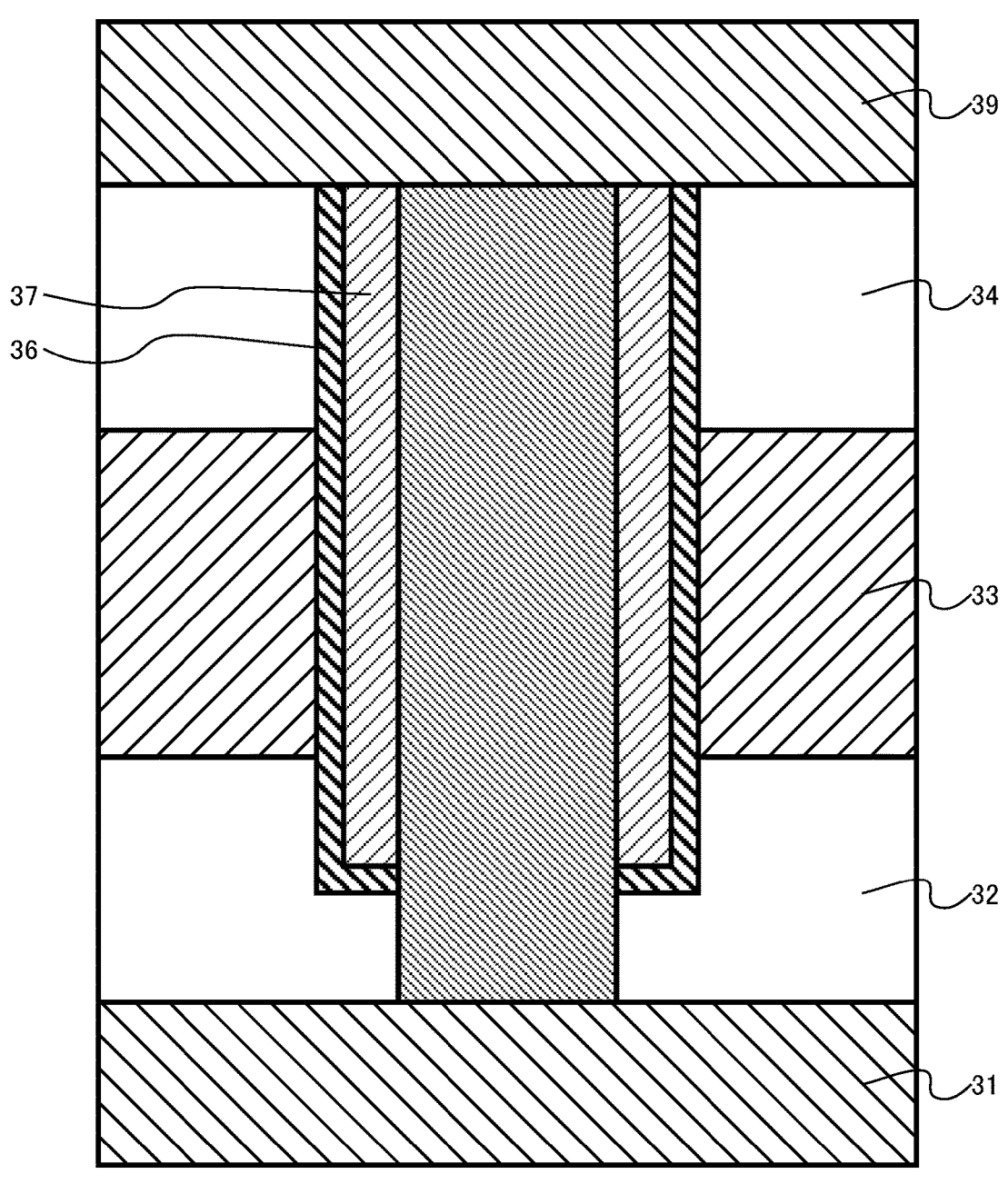
FIG. 9 is a schematic cross-sectional view showing an example of the method for manufacturing the semiconductor device according to the first embodiment.

Then, a second indium tin oxide film 39 is formed (FIG. 9). The second indium tin oxide film 39 is formed by using, for example, a CVD method. The second indium tin oxide film 39 finally becomes the second electrode 14.

By the manufacturing method described above, the transistor 100 shown in FIGS. 1 and 2 is manufactured.

Hereinafter, the function and effect of the semiconductor device according to the first embodiment will be described.

An oxide semiconductor transistor in which a channel is formed in an oxide semiconductor layer has an excellent characteristic that the channel leakage current during off operation is very small. For this reason, for example, the oxide semiconductor transistor can be applied to a switching transistor of a memory cell of a DRAM. By applying the oxide semiconductor transistor to a switching transistor, the charge storage characteristics of the DRAM are improved.

Figure 10:
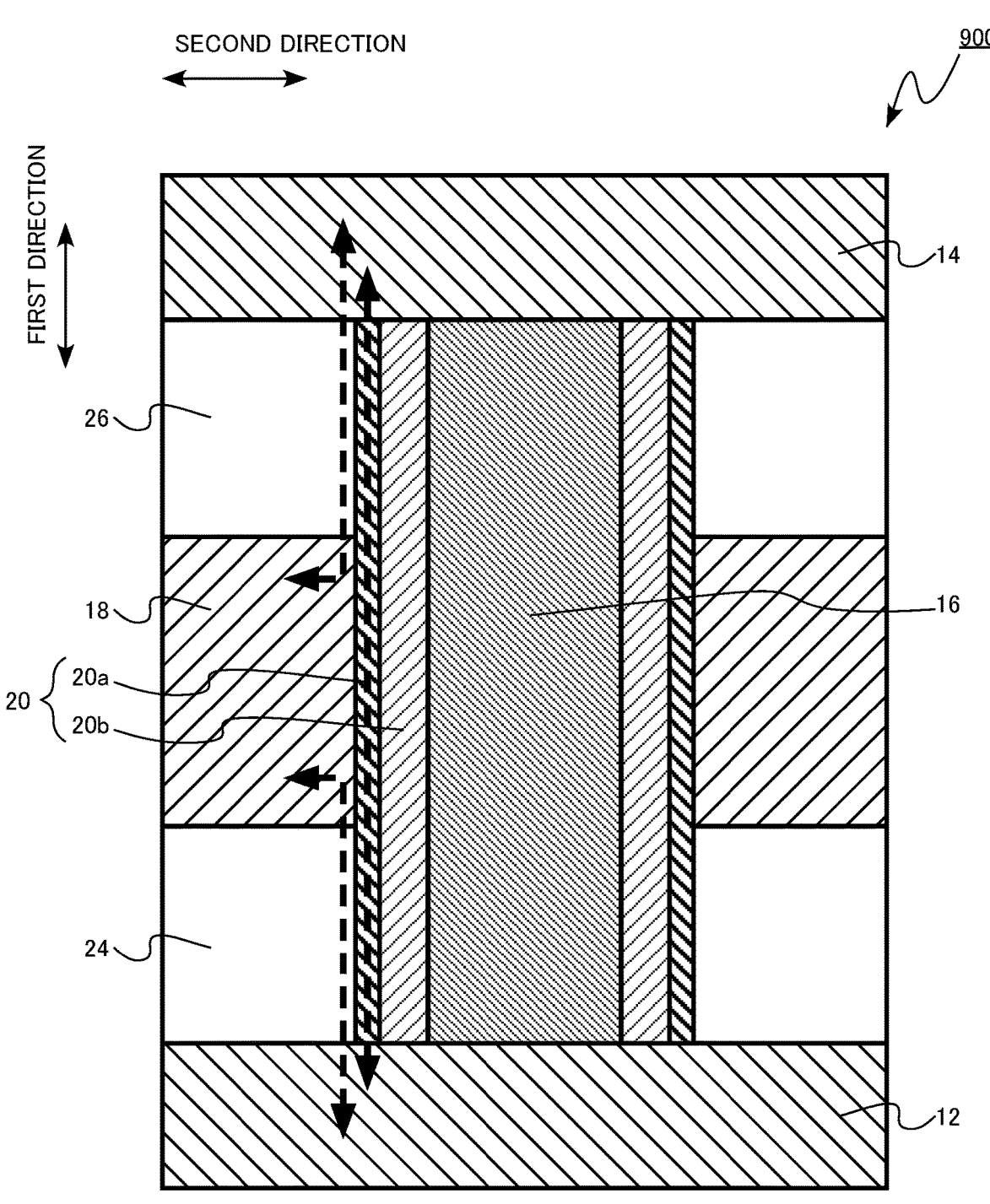
FIG. 10 is a schematic cross-sectional view of a semiconductor device of a comparative example.

FIG. 10 is a schematic cross-sectional view of a semiconductor device of a comparative example. FIG. 10 is a diagram corresponding to FIG. 1 of the semiconductor device according to the first embodiment.

The semiconductor device of the comparative example is a transistor 900. The transistor 900 is an oxide semiconductor transistor. The transistor 900 is different from the transistor 100 according to the first embodiment in that the gate insulating layer 20 is in contact with the first electrode 12.

In the transistor 900 of the comparative example, the gate insulating layer 20 includes the first film 20a and the second film 20b, as in the transistor 100 according to the first embodiment. The nitrogen concentration of the first film 20a is higher than the nitrogen concentration of the second film 20b.

By providing the first film 20a having a high nitrogen concentration between the second film 20b and the gate electrode 18, for example, it is possible to suppress an increase in the leakage current of the gate insulating layer 20 or a decrease in the reliability of the gate insulating layer 20 due to the metal contained in the gate electrode 18 entering the gate insulating layer 20. In addition, for example, by providing the first film 20a having a high nitrogen concentration between the second film 20b and the gate electrode 18, the dielectric constant of the gate insulating layer 20 increases and accordingly, the on-current of the transistor 900 increases.

On the other hand, for example, the leakage current caused by the trap level in the first film 20a having a high nitrogen concentration may increase the off-leakage current of the transistor 900. For example, as shown by the dotted arrow in FIG. 10, the leakage current flowing between the second electrode 14 and the first electrode 12 in the gate insulating layer 20 may increase the off-leakage current of the transistor 900. In addition, for example, as shown by the dotted arrow in FIG. 10, the leakage current flowing between the gate electrode 18 and the first electrode 12 in the gate insulating layer 20 may increase the off-leakage current of the transistor 900. In addition, for example, as shown by the dotted arrow in FIG. 10, the leakage current flowing between the gate electrode 18 and the second electrode 14 in the gate insulating layer 20 may increase the off-leakage current of the transistor 900.

In the transistor 100 according to the first embodiment, the gate insulating layer 20 is spaced from the first electrode 12. Therefore, the leakage current flowing between the second electrode 14 and the first electrode 12 in the gate insulating layer 20 is suppressed. In addition, the leakage current flowing between the gate electrode 18 and the first electrode 12 in the gate insulating layer 20 can be suppressed. As a result, the off-leakage current of the transistor 100 is reduced.

From the viewpoint of reducing the off-leakage current, it is preferable that the first distance (d1 in FIG. 1) between the first electrode 12 and the gate insulating layer 20 in the first direction is larger than the thickness of the gate insulating layer 20 in the second direction. In addition, from the viewpoint of reducing the off-leakage current, it is preferable that the first distance d1 is, for example, equal to or more than 5 nm.

It is preferable that the first distance (d1 in FIG. 1) between the first electrode 12 and the gate insulating layer 20 in the first direction is smaller than the second distance (d2 in FIG. 1) between the first electrode 12 and the gate electrode 18 in the first direction. Since the gate insulating layer 20 having a high dielectric constant extends to the first electrode 12 side rather than the gate electrode 18, the gate fringe electric field applied to the oxide semiconductor layer 16 increases. Therefore, the on-current of the transistor 100 increases.

From the viewpoint of increasing the gate fringe electric field applied to the oxide semiconductor layer 16, it is preferable that the difference between the second distance d2 and the first distance d1 is larger than the thickness of the gate insulating layer 20 in the second direction. In addition, from the viewpoint of increasing the gate fringe electric field applied to the oxide semiconductor layer 16, it is preferable that the difference between the second distance d2 and the first distance d1 is equal to or more than 5 nm.

From the viewpoint of suppressing the leakage current flowing through the gate insulating layer 20, it is preferable that the thickness of the second film 20b is larger than the thickness of the first film 20a. In other words, from the viewpoint of suppressing the leakage current flowing through the gate insulating layer 20, it is preferable that the thickness of the first film 20a is smaller than the thickness of the second film 20b.

Modification Example

Figure 11:
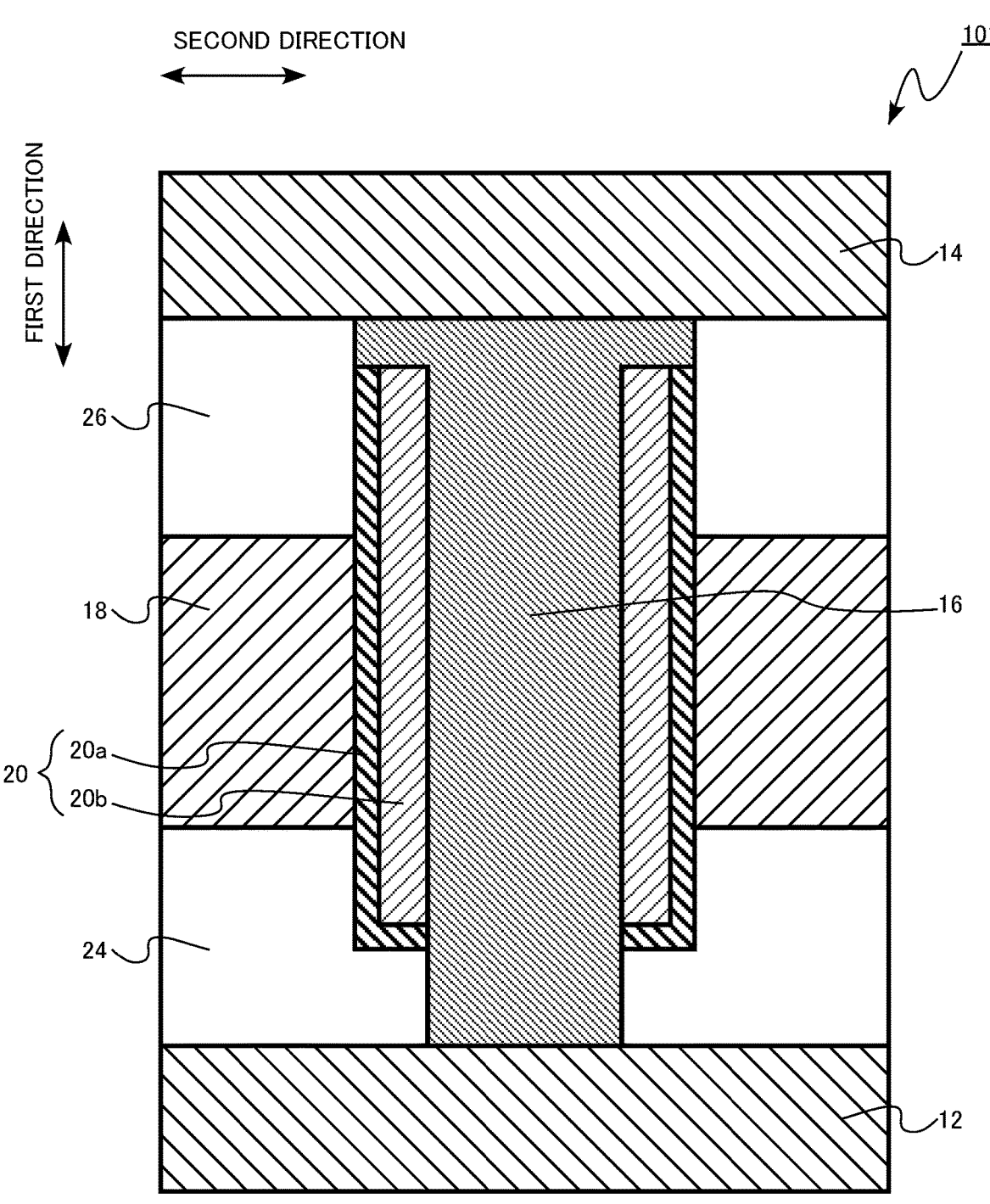
FIG. 11 is a schematic cross-sectional view of a semiconductor device of a modification example of the first embodiment.

FIG. 11 is a schematic cross-sectional view of a semiconductor device of a modification example of the first embodiment. The semiconductor device of the modification example of the first embodiment is different from the semiconductor device according to the first embodiment in that the gate insulating layer is spaced from the second electrode.

The semiconductor device of the modification example of the first embodiment includes a transistor 101. The gate insulating layer 20 of the transistor 101 is spaced from the second electrode 14. In the first direction, the oxide semiconductor layer 16 is provided between the gate insulating layer 20 and the second electrode 14.

The semiconductor device of the modification example of the first embodiment can be manufactured, for example, by increasing the amount of overetching when etching the third silicon oxide film 37, the silicon nitride film 36, and the first silicon oxide film 32 at the bottom of the opening 35 in the method for manufacturing the semiconductor device according to the first embodiment (see FIG. 7).

According to the transistor 101 of the modification example, it is possible to suppress the leakage current flowing between the gate electrode 18 and the second electrode 14 in the gate insulating layer 20. As a result, it is possible to suppress the off-leakage current of the transistor 101.

As described above, according to the first embodiment and its modification example, the off-leakage current of the transistor is suppressed, so that a semiconductor device having excellent transistor characteristics is realized.

Second Embodiment

A semiconductor device according to a second embodiment is different from the semiconductor device according to the first embodiment in that the gate insulating layer is a single film. Hereinafter, the description of a part of the content overlapping the first embodiment may be omitted.

Figure 12:
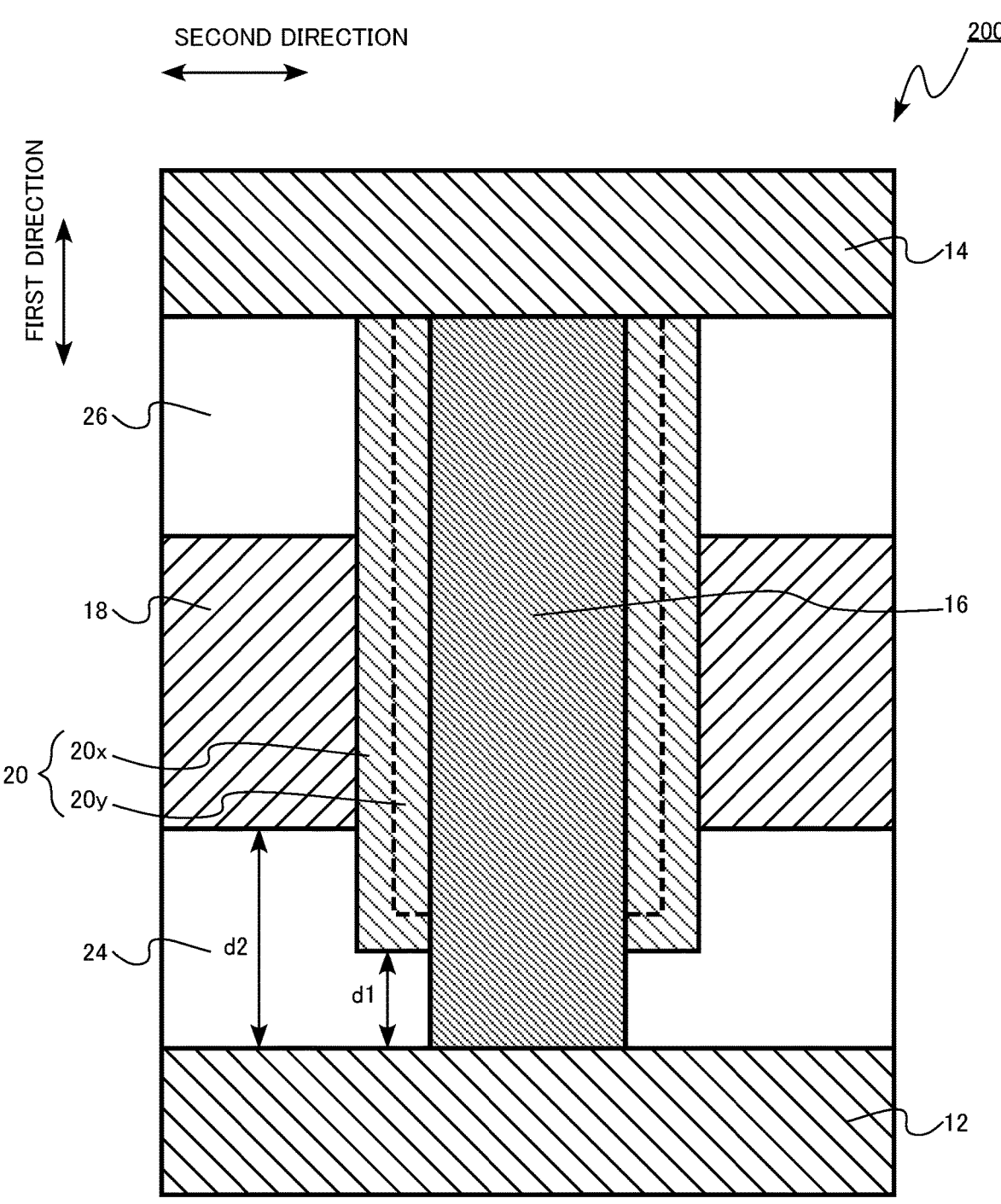
FIG. 12 is a schematic cross-sectional view of a semiconductor device according to a second embodiment.

FIG. 12 is a schematic cross-sectional view of the semiconductor device according to the second embodiment. FIG. 12 is a diagram corresponding to FIG. 1 of the first embodiment.

The semiconductor device according to the second embodiment is a transistor 200. The transistor 200 is an SGT. The transistor 200 is a so-called vertical transistor.

The transistor 200 includes a first electrode 12, a second electrode 14, an oxide semiconductor layer 16, a gate electrode 18, a gate insulating layer 20, a first insulating layer 24, and a second insulating layer 26. The gate insulating layer 20 includes a high nitrogen concentration region 20x and a low nitrogen concentration region 20y.

The high nitrogen concentration region 20x is an example of the first region. The low nitrogen concentration region 20y is an example of the second region.

The gate insulating layer 20 is provided between the gate electrode 18 and the oxide semiconductor layer 16. The gate insulating layer 20 is provided so as to surround the oxide semiconductor layer 16. The gate insulating layer 20 is in contact with the oxide semiconductor layer 16.

The gate insulating layer 20 is spaced from the first electrode 12. The gate insulating layer 20 is spaced from the first electrode 12 in the first direction. The gate insulating layer 20 is in contact with the second electrode 14.

The first distance (d1 in FIG. 1) between the first electrode 12 and the gate insulating layer 20 in the first direction is smaller than the second distance (d2 in FIG. 1) between the first electrode 12 and the gate electrode 18 in the first direction. The first distance d1 is, for example, larger than the thickness of the gate insulating layer 20 in the second direction. The first distance d1 is, for example, equal to or more than 5 nm. The difference between the second distance d2 and the first distance d1 is, for example, larger than the thickness of the gate insulating layer 20 in the second direction.

The gate insulating layer 20 includes a high nitrogen concentration region 20x and a low nitrogen concentration region 20y. The low nitrogen concentration region 20y is provided between the high nitrogen concentration region 20x and the oxide semiconductor layer 16. The high nitrogen concentration region 20x is provided between the low nitrogen concentration region 20y and the gate electrode 18.

In the first direction, the high nitrogen concentration region 20x is provided between the first electrode 12 and the low nitrogen concentration region 20y. In the first direction, the high nitrogen concentration region 20x is provided between the first insulating layer 24 and the low nitrogen concentration region 20y.

The gate insulating layer 20 is a single film. The gate insulating layer 20 contains nitrogen (N).

The nitrogen concentration in the high nitrogen concentration region 20x is higher than the nitrogen concentration in the low nitrogen concentration region 20y. The nitrogen concentration distribution in the gate insulating layer 20 continuously increases from the oxide semiconductor layer 16 side to the gate electrode 18 side, for example.

The gate insulating layer 20 is, for example, an oxynitride film. The gate insulating layer 20 contains, for example, silicon oxynitride, aluminum oxynitride, hafnium oxynitride, or zirconium oxynitride. The gate insulating layer 20 is, for example, a silicon oxynitride film, an aluminum oxynitride film, a hafnium oxynitride film, or a zirconium oxynitride film.

The thickness of the gate insulating layer 20 is, for example, equal to or more than 2 nm and equal to or less than 10 nm.

According to the transistor 200 of the second embodiment, the leakage current flowing through the gate insulating layer 20 can be suppressed by the same function as in the first embodiment. As a result, the off-leakage current of the transistor 200 is reduced.

Modification Example

Figure 13:
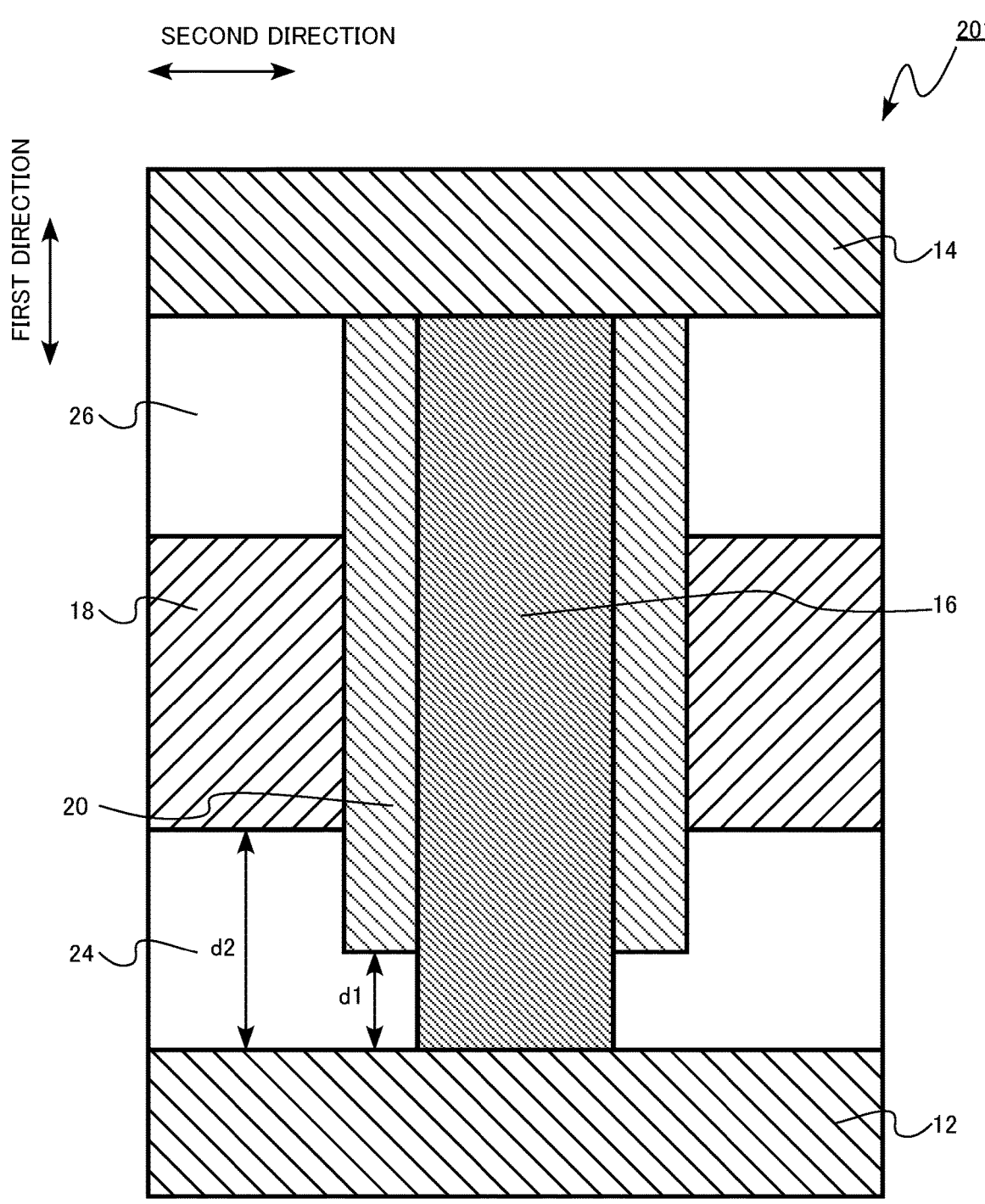
FIG. 13 is a schematic cross-sectional view of a semiconductor device of a modification example of the second embodiment.

FIG. 13 is a schematic cross-sectional view of a semiconductor device of a modification example of the second embodiment. The semiconductor device of the modification example of the second embodiment is different from the semiconductor device according to the second embodiment in that the gate insulating layer does not include the first region and the second region.

The semiconductor device of the modification example of the second embodiment includes a transistor 201. The gate insulating layer 20 of the transistor 201 does not include the high nitrogen concentration region 20x and the low nitrogen concentration region 20y. The nitrogen concentration distribution in the gate insulating layer 20 of the transistor 201 is uniform, for example.

According to the transistor 201 of the modification example, it is possible to suppress the leakage current flowing in the gate insulating layer 20. As a result, it is possible to suppress the off-leakage current of the transistor 201.

As described above, according to the second embodiment and its modification example, the off-leakage current of the transistor is suppressed, so that a semiconductor device having excellent transistor characteristics is realized.

Third Embodiment

A semiconductor device according to a third embodiment is different from the semiconductor device according to the first embodiment in that, in a cross section parallel to the first direction, the length of the interface between the first electrode and the oxide semiconductor layer in the second direction perpendicular to the first direction is shorter than the length of the interface between the second electrode and the oxide semiconductor layer in the second direction. Hereinafter, the description of a part of the content overlapping the first embodiment may be omitted.

Figure 14:
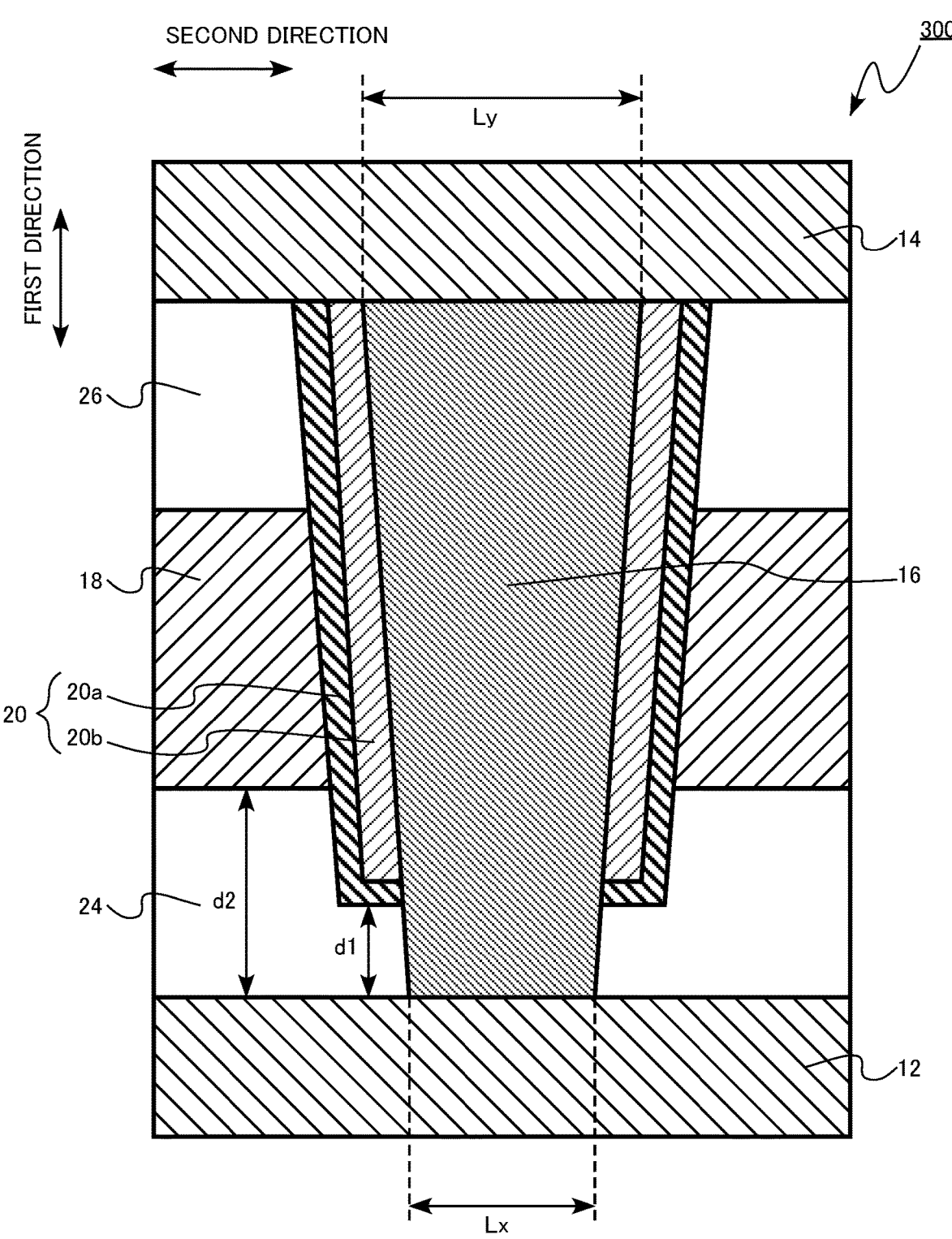
FIG. 14 is a schematic cross-sectional view of a semiconductor device according to a third embodiment.

FIG. 14 is a schematic cross-sectional view of the semiconductor device according to the third embodiment. FIG. 14 is a diagram corresponding to FIG. 1 of the first embodiment.

The semiconductor device according to the third embodiment is a transistor 300. The transistor 300 is an SGT. The transistor 300 is a so-called vertical transistor.

The transistor 300 includes a first electrode 12, a second electrode 14, an oxide semiconductor layer 16, a gate electrode 18, a gate insulating layer 20, a first insulating layer 24, and a second insulating layer 26. The gate insulating layer 20 includes a first film 20a and a second film 20b.

The first film 20a is an example of the first region. The second film 20b is an example of the second region.

As shown in FIG. 14, in a cross section parallel to the first direction, the length (Lx in FIG. 14) of the interface between the first electrode 12 and the oxide semiconductor layer 16 in the second direction perpendicular to the first direction is shorter than the length (Ly in FIG. 14) of the interface between the second electrode 14 and the oxide semiconductor layer 16 in the second direction. In other words, the length Ly of the interface between the second electrode 14 and the oxide semiconductor layer 16 in the second direction is larger than the length Lx of the interface between the first electrode 12 and the oxide semiconductor layer 16 in the second direction. In the cross section parallel to the first direction, the side surface of the oxide semiconductor layer 16 has a forward tapered shape.

In the cross section perpendicular to the first direction, the width of the oxide semiconductor layer 16 in the second direction decreases from the second electrode 14 to the first electrode 12, for example.

By making the length Ly of the interface between the second electrode 14 and the oxide semiconductor layer 16 in the second direction larger than the length Lx of the interface between the first electrode 12 and the oxide semiconductor layer 16 in the second direction, the contact area between the second electrode 14 and the oxide semiconductor layer 16 becomes larger than the contact area between the first electrode 12 and the oxide semiconductor layer 16. Therefore, for example, the contact resistance between the second electrode 14 and the oxide semiconductor layer 16 can be reduced.

As described above, according to the third embodiment, the off-leakage current of the transistor is suppressed, so that a semiconductor device having excellent transistor characteristics is realized.

Fourth Embodiment

A semiconductor memory device according to a fourth embodiment includes the semiconductor device according to the first embodiment and a capacitor electrically connected to the first electrode or the second electrode.

The semiconductor memory device according to the fourth embodiment is a semiconductor memory 400. The semiconductor memory device according to the fourth embodiment is a DRAM. In the semiconductor memory 400, the transistor 100 according to the first embodiment is used as a switching transistor of a memory cell of a DRAM.

Hereinafter, the description of a part of the content overlapping the first embodiment will be omitted.

Figure 15:
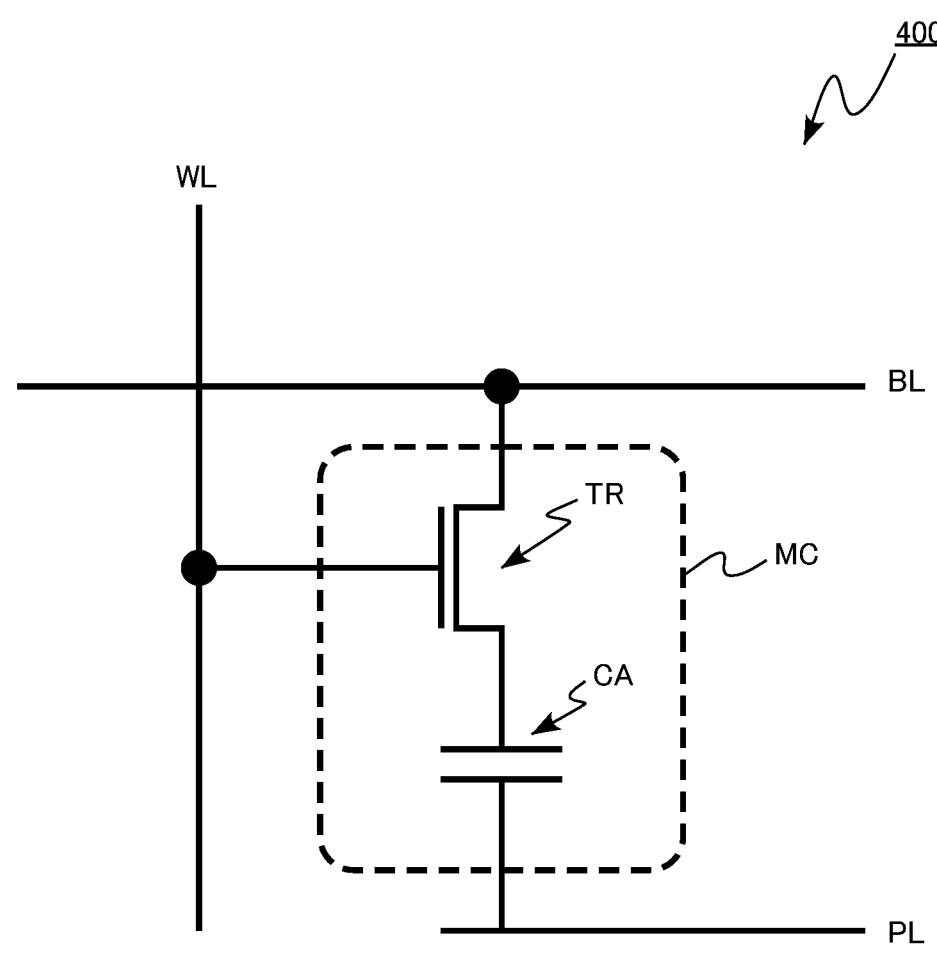
FIG. 15 is an equivalent circuit diagram of a semiconductor memory device according to a fourth embodiment.

FIG. 15 is an equivalent circuit diagram of the semiconductor memory device according to the fourth embodiment. FIG. 15 illustrates a case where one memory cell MC is provided. However, for example, a plurality of memory cells MC may be provided in an array.

The semiconductor memory 400 includes the memory cell MC, a word line WL, a bit line BL, and a plate line PL. The memory cell MC includes a switching transistor TR and a capacitor CA. In FIG. 15, the region surrounded by the broken line is the memory cell MC.

The word line WL is electrically connected to the gate electrode of the switching transistor TR. The bit line BL is electrically connected to one of the source electrode and the drain electrode of the switching transistor TR. One electrode of the capacitor CA is electrically connected to the other one of the source electrode and the drain electrode of the switching transistor TR. The other electrode of the capacitor CA is connected to the plate line PL.

The memory cell MC stores data by storing charges in the capacitor CA. Data is written and read by turning on the switching transistor TR.

For example, data is written into the memory cell MC by turning on the switching transistor TR in a state in which a desired voltage is applied to the bit line BL.

In addition, for example, a voltage change in the bit line BL according to the amount of charge stored in the capacitor is detected by turning on the switching transistor TR, thereby reading the data of the memory cell MC.

Figure 16:
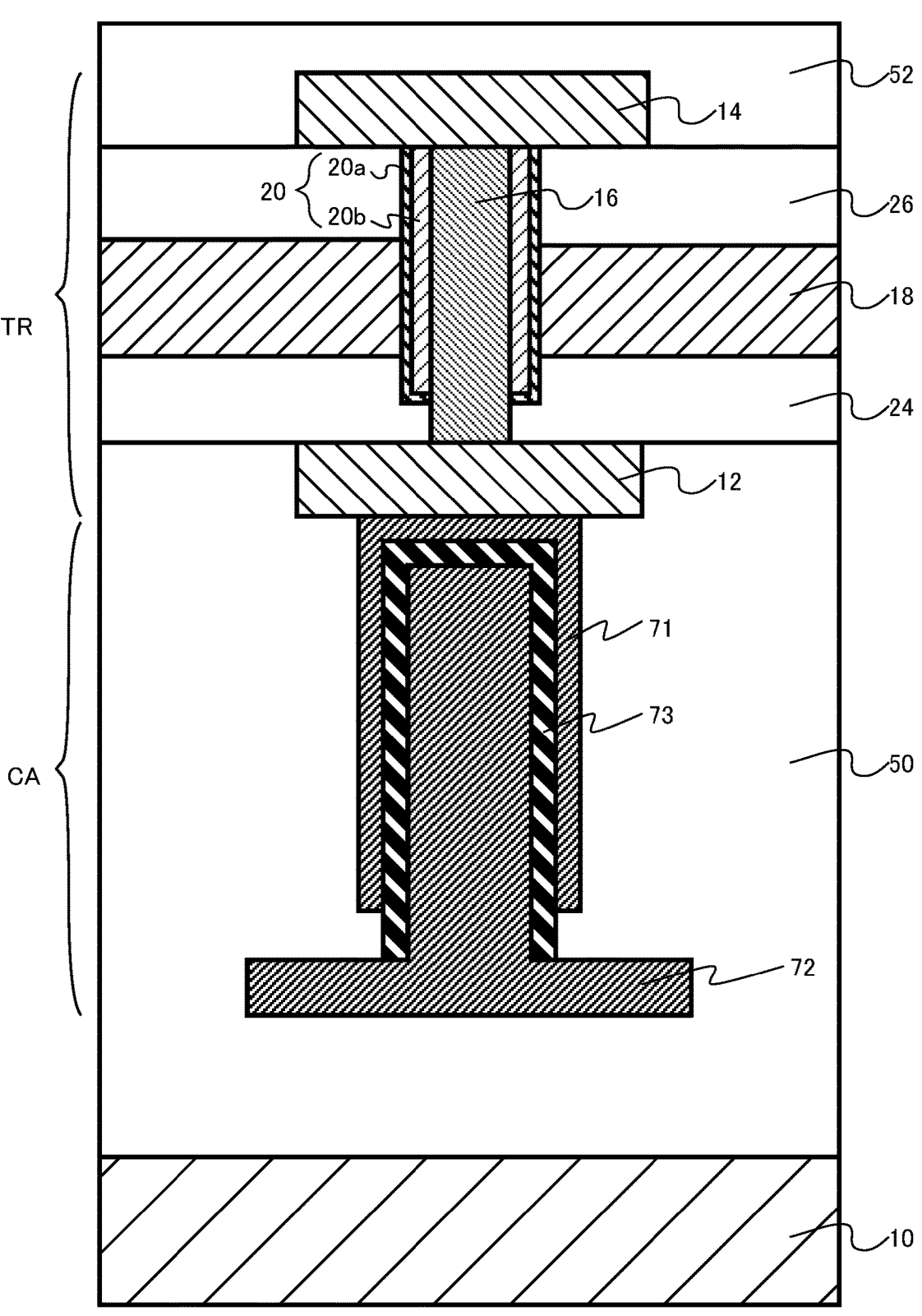
FIG. 16 is a schematic cross-sectional view of the semiconductor memory device according to the fourth embodiment.

FIG. 16 is a schematic cross-sectional view of the semiconductor memory device according to the fourth embodiment. FIG. 16 shows a cross section of the memory cell MC of the semiconductor memory 400.

The semiconductor memory 400 includes a silicon substrate 10, the switching transistor TR, the capacitor CA, a first interlayer insulating layer 50, and a second interlayer insulating layer 52.

The silicon substrate 10 is, for example, single crystal silicon. The substrate may be, for example, a semiconductor substrate other than the silicon substrate. The substrate may be, for example, an insulating substrate.

The switching transistor TR includes a first electrode 12, a second electrode 14, an oxide semiconductor layer 16, a gate electrode 18, a gate insulating layer 20, a first insulating layer 24, and a second insulating layer 26. The gate insulating layer 20 includes a first film 20a and a second film 20b. The first film 20a is an example of the first region. The second film 20b is an example of the second region.

The switching transistor TR has a structure similar to that of the transistor 100 according to the first embodiment.

The capacitor CA is provided between the silicon substrate 10 and the switching transistor TR. The capacitor CA is provided between the silicon substrate 10 and the first electrode 12. The capacitor CA is electrically connected to the first electrode 12.

The capacitor CA includes a cell electrode 71, a plate electrode 72, and a capacitor insulating film 73. The cell electrode 71 is electrically connected to the first electrode 12. The cell electrode 71 is in contact with, for example, the first electrode 12.

The cell electrode 71 and the plate electrode 72 are, for example, titanium nitride. The capacitor insulating film 73 has, for example, a stacked structure of zirconium oxide, aluminum oxide, and zirconium oxide.

The gate electrode 18 is electrically connected to, for example, the word line WL (not shown). The second electrode 14 is electrically connected to, for example, the bit line BL (not shown). The plate electrode 72 is connected to, for example, the plate line PL (not shown).

In the semiconductor memory 400, an oxide semiconductor transistor having a very small channel leakage current during off operation is applied to the switching transistor TR. Therefore, a DRAM having an excellent charge storage characteristic is realized.

In particular, since the gate insulating layer 20 is spaced from the first electrode 12 electrically connected to the cell electrode 71, the escape of the charge stored in the capacitor CA to the gate electrode 18 through the gate insulating layer 20 is suppressed. Therefore, the charge storage characteristics of the semiconductor memory 400 are improved.

In the fourth embodiment, a semiconductor memory to which the transistor according to the first embodiment is applied has been described as an example. However, the semiconductor memory of embodiments may be a semiconductor memory to which the transistor according to the second embodiment or the third embodiment is applied.

In the fourth embodiment, a semiconductor memory in which a cell electrode is electrically connected to the first electrode 12 has been described as an example. However, the semiconductor memory of embodiments may be a semiconductor memory in which a cell electrode is electrically connected to the second electrode 14.

The capacitor CA may have a structure provided on the switching transistor TR. A structure in which a switching transistor TR is provided between the silicon substrate 10 and the capacitor CA may be used.

While certain embodiments have been described, these embodiments have been presented by way of example only, and are not intended to limit the scope of the inventions. Indeed, the semiconductor device and the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first electrode;
a second electrode;
an oxide semiconductor layer provided between the first electrode and the second electrode, and the oxide semiconductor layer being in contact with the first electrode;
a gate electrode surrounding the oxide semiconductor layer;
a gate insulating layer provided between the gate electrode and the oxide semiconductor layer, the gate insulating layer spaced from the first electrode, and the gate insulating layer containing nitrogen (N); and
a first insulating layer provided between the first electrode and the gate insulating layer in a first direction from the first electrode to the second electrode,
wherein a first distance between the first electrode and the gate insulating layer in the first direction is smaller than a second distance between the first electrode and the gate electrode in the first direction.

2. The semiconductor device according to claim 1,
wherein the first distance is larger than a thickness of the gate insulating layer.

3. The semiconductor device according to claim 1,
wherein a difference between the second distance and the first distance is larger than a thickness of the gate insulating layer.

4. The semiconductor device according to claim 1,
wherein the gate insulating layer includes a first region and a second region between the oxide semiconductor layer and the first region, and a nitrogen concentration in the first region is higher than a nitrogen concentration in the second region.

5. The semiconductor device according to claim 4,
wherein the first region is provided between the first electrode and the second region in the first direction.

6. The semiconductor device according to claim 4,
wherein the first region contains silicon nitride, and the second region contains silicon oxide.

7. The semiconductor device according to claim 4,
wherein a thickness of the second region is larger than a thickness of the first region.

8. The semiconductor device according to claim 1,
wherein the gate insulating layer is in contact with the second electrode.

9. The semiconductor device according to claim 1,
wherein the gate insulating layer is spaced from the second electrode.

10. The semiconductor device according to claim 1,
wherein, in a cross section parallel to the first direction, a length of an interface between the first electrode and the oxide semiconductor layer in a second direction perpendicular to the first direction is shorter than a length of an interface between the second electrode and the oxide semiconductor layer in the second direction.

11. A semiconductor memory device, comprising:
the semiconductor device according to claim 1; and
a capacitor electrically connected to the first electrode or the second electrode.

12. A semiconductor device, comprising:
a first electrode;
a second electrode;
an oxide semiconductor layer provided between the first electrode and the second electrode, and the oxide semiconductor layer being in contact with the first electrode;
a gate electrode surrounding the oxide semiconductor layer;
a gate insulating layer provided between the gate electrode and the oxide semiconductor layer, the gate insulating layer spaced from the first electrode, the gate insulating layer including a first region and a second region between the first region and the oxide semiconductor layer, and a nitrogen concentration in the first region being higher than a nitrogen concentration in the second region; and
a first insulating layer provided between the first electrode and the gate insulating layer in a first direction from the first electrode to the second electrode.

13. The semiconductor device according to claim 12,
wherein the first region is provided between the first electrode and the second region in the first direction.

14. The semiconductor device according to claim 12,
wherein the first region contains silicon nitride, and the second region contains silicon oxide.

15. The semiconductor device according to claim 12,
wherein a thickness of the second region is larger than a thickness of the first region.

16. The semiconductor device according to claim 12,
wherein the first distance between the first electrode and the gate insulating layer in the first direction is larger than a thickness of the gate insulating layer.

17. The semiconductor device according to claim 12,
wherein the gate insulating layer is in contact with the second electrode.

18. The semiconductor device according to claim 12,
wherein the gate insulating layer is spaced from the second electrode.

19. The semiconductor device according to claim 12,
wherein, in a cross section parallel to the first direction, a length of an interface between the first electrode and the oxide semiconductor layer in a second direction perpendicular to the first direction is shorter than a length of an interface between the second electrode and the oxide semiconductor layer in the second direction.

20. A semiconductor device, comprising:
the semiconductor device according to claim 12; and
a capacitor electrically connected to the first electrode or the second electrode.

* * * * *